United States Patent
Adusumilli et al.

(10) Patent No.: US 11,322,359 B2
(45) Date of Patent: May 3, 2022

(54) SINGLE PROCESS FOR LINER AND METAL FILL

(71) Applicant: ELPIS TECHNOLOGIES INC., Ottawa (CA)

(72) Inventors: Praneet Adusumilli, Somerset, NJ (US); Alexander Reznicek, Troy, NY (US); Oscar van der Straten, Guilderland Center, NY (US); Chih-Chao Yang, Glenmont, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

(21) Appl. No.: 16/874,317

(22) Filed: May 14, 2020

(65) Prior Publication Data

US 2020/0273708 A1    Aug. 27, 2020

Related U.S. Application Data

(62) Division of application No. 16/235,309, filed on Dec. 28, 2018, now Pat. No. 10,692,722, which is a
(Continued)

(51) Int. Cl.
*H01L 21/28*     (2006.01)
*H01L 29/49*     (2006.01)
(Continued)

(52) U.S. Cl.
CPC .... *H01L 21/28088* (2013.01); *H01L 21/2855* (2013.01); *H01L 21/28568* (2013.01);
(Continued)

(58) Field of Classification Search
CPC ......... H01L 21/28088; H01L 21/28568; H01L 21/76838; H01L 23/53261; H01L 23/53266; H01L 21/76843; H01L 21/76877; H01L 29/785; H01L 29/4966; H01L 29/66545; H01L 29/66795; H01L 21/2855; H01L 23/485; H01L 29/7848; H01L 29/165; H01L 29/517; H01L 29/518
See application file for complete search history.

(56) References Cited

U.S. PATENT DOCUMENTS 4,994,410 A    2/1991    Sun et al.
6,217,721 B1   4/2001    Xu et al.
(Continued)

OTHER PUBLICATIONS

Lii, D. et al., "The effects of TiAl interlayer on PVD TiAlN films", Surface and Coatings Techn., 1998, pp. 197-202, vol. 99.
(Continued)

*Primary Examiner* — Julia Slutsker
(74) *Attorney, Agent, or Firm* — Scully Scott Murphy and Presser

(57) ABSTRACT

After forming a contact opening in a dielectric material layer located over a substrate, a metal liner layer comprising a nitride of an alloy and a metal contact layer comprising the alloy that provides the metal liner layer are deposited in-situ in the contact opening by sputter deposition in a single process and without an air break. Compositions of the metal liner layer and the metal contact layer can be changed by varying gas compositions employed in the sputtering process.

13 Claims, 6 Drawing Sheets

Related U.S. Application Data division of application No. 15/082,646, filed on Mar. 28, 2016, now Pat. No. 10,249,501.

(51) Int. Cl.
  *H01L 29/66* (2006.01)
  *H01L 21/285* (2006.01)
  *H01L 29/78* (2006.01)
  *H01L 23/532* (2006.01)
  *H01L 21/768* (2006.01)
  *H01L 29/51* (2006.01)
  *H01L 29/165* (2006.01)
  *H01L 23/485* (2006.01)

(52) U.S. Cl.
  CPC .. *H01L 21/76838* (2013.01); *H01L 21/76843* (2013.01); *H01L 21/76877* (2013.01); *H01L 23/53261* (2013.01); *H01L 23/53266* (2013.01); *H01L 29/4966* (2013.01); *H01L 29/66545* (2013.01); *H01L 29/66795* (2013.01); *H01L 29/785* (2013.01); *H01L 23/485* (2013.01); *H01L 29/165* (2013.01); *H01L 29/517* (2013.01); *H01L 29/518* (2013.01); *H01L 29/7848* (2013.01)

(56) References Cited

U.S. PATENT DOCUMENTS

| | | | |
|---|---|---|---|
| 6,429,519 B1 | 8/2002 | Uzoh | |
| 6,433,429 B1 | 8/2002 | Stamper | |
| 8,633,516 B1 | 1/2014 | Wu et al. | |
| 2002/0001906 A1 | 1/2002 | Park | |
| 2008/0088021 A1* | 4/2008 | Wada | H01L 21/76831 257/751 |
| 2013/0062701 A1* | 3/2013 | Lee | H01L 29/665 257/369 |
| 2013/0113027 A1 | 5/2013 | Chiang et al. | |
| 2013/0200470 A1 | 8/2013 | Liu et al. | |
| 2014/0097504 A1 | 4/2014 | Caubet et al. | |
| 2014/0319676 A1 | 10/2014 | Matsuo et al. | |
| 2015/0145027 A1 | 5/2015 | Lin et al. | |
| 2015/0155365 A1 | 6/2015 | Lee et al. | |
| 2015/0262828 A1 | 9/2015 | Brand et al. | |
| 2015/0303281 A1 | 10/2015 | Fogel et al. | |
| 2016/0020118 A1 | 1/2016 | Park et al. | |
| 2016/0111324 A1* | 4/2016 | Chiu | H01L 21/76804 438/653 |
| 2017/0162393 A1* | 6/2017 | Li | H01L 21/2855 |

OTHER PUBLICATIONS

Alford, T.L. et al., "Abnormal electrical resistivity in y-TiAl thin films deposited by magnetron sputtering", Applied Physics Letters, 2003, pp. 455 457, vol. 83, No. 3.

List of IBM Patents or Patent Applications Treated as Related dated May 14, 2020, 2 pages.

* cited by examiner

SINGLE PROCESS FOR LINER AND METAL FILL

BACKGROUND

The present application relates to the fabrication of metallization structures for semiconductor devices, and more particularly, to the fabrication of metallization structures with reduced contact resistance.

In semiconductor technologies, tungsten (W) is typically used as a middle-of-the-line (MOL) contact material because of its relatively low resistance, less stress, and electromigration properties. MOL contacts are typically formed within contact openings present in a dielectric material layer deposited on top of active semiconductor devices. The MOL contact may extend to surfaces of the contact areas of underlying semiconductor devices. Due to the high aspect ratio and small feature size of the contact openings, W is deposited by a chemical vapor deposition (CVD) process, which usually includes a tungsten hexafluoride (WF6) precursor. To prevent the diffusion of fluorine during W deposition, a relatively thick metal liner with a thickness greater than 2 nm is required.

As the dimensions of MOL contacts are scaled down, the currently used W metallization scheme cannot meet the resistance targets for future technology nodes. This high resistance for W-based MOL contacts is a result of the need for a thick metal liner and the poor gap filling property of W which results in formation of seams and voids in the MOL contacts. Therefore, a method for forming MOL contacts with reduced contact resistance remains needed.

SUMMARY

The present application provides a method for the formation of metallization structures with reduced contact resistance. The method of the present application can also be employed to form gate structures in a gate last scheme. After forming a contact opening in a dielectric material layer located over a substrate, a metal liner layer comprising a nitride of an alloy and a metal contact layer comprising the alloy that provides the metal liner layer are deposited in-situ in the contact opening by sputter deposition in a single process and without an air break. Compositions of the metal liner layer and the metal contact layer can be changed by varying gas compositions employed in the sputtering process.

In one aspect of the present application, a metallization structure is provided. The metallization structure includes a contact opening laterally surrounded by a dielectric material layer located over a substrate, a metal liner located along sidewalls and a bottom surface of the contact opening, and a metal contact located on the metal liner to fill a remaining volume of the contact opening. The metal contact includes an alloy selected from the group consisting of TiAl, MgAl, MgTi, MgV and AlV, and the metal liner includes a nitride of the alloy.

In another aspect of the present application, a semiconductor structure including a gate structure is provided. The gate structure includes a gate cavity laterally surrounded by a gate spacer. The gate cavity exposes a channel portion of a semiconductor fin located over a substrate. The gate structure further includes a gate dielectric located along sidewalls and a bottom surface of the gate cavity, a first metal liner located on the gate dielectric, a second metal liner located on the first metal liner, and a metal gate electrode located on the second metal liner. The metal gate electrode includes an alloy selected from the group consisting of TiAl, MgAl, MgTi, MgV and AlV, the first metal liner includes a carbide of the alloy and the second metal liner includes a nitride of the alloy.

In another aspect of the present application, a method of forming a semiconductor structure is provided. The method includes forming a sacrificial gate structure straddling a portion of a semiconductor fin located over a substrate. The sacrificial gate structure includes a sacrificial gate stack and a gate spacer located on sidewalls of the sacrificial gate stack. An interlevel dielectric (ILD) layer is then formed laterally surrounding the sacrificial gate structure. After removing the sacrificial gate stack to provide a gate cavity, a gate dielectric layer is formed along sidewalls and a bottom surface of the gate cavity and on a top surface of the ILD layer. Next, a first metal liner layer is formed on the gate dielectric layer by sputtering at least one target comprising components of an alloy selected from the group consisting of TiAl, MgAl, MgTi, MgV and AlV in a hydrocarbon-containing sputtering atmosphere in a sputtering apparatus. Next, without an air break to expose the first metal liner layer to an oxygen-containing atmosphere, a second metal liner layer is formed on the first metal liner layer by sputtering the at least one target in a nitrogen-containing sputtering atmosphere. Without an air break to expose the second metal liner layer to the oxygen-containing atmosphere, a metal gate layer is subsequently formed on the second meal liner layer by sputtering the at least one target in a nitrogen-free sputtering atmosphere.

DETAILED DESCRIPTION

Figure 1:
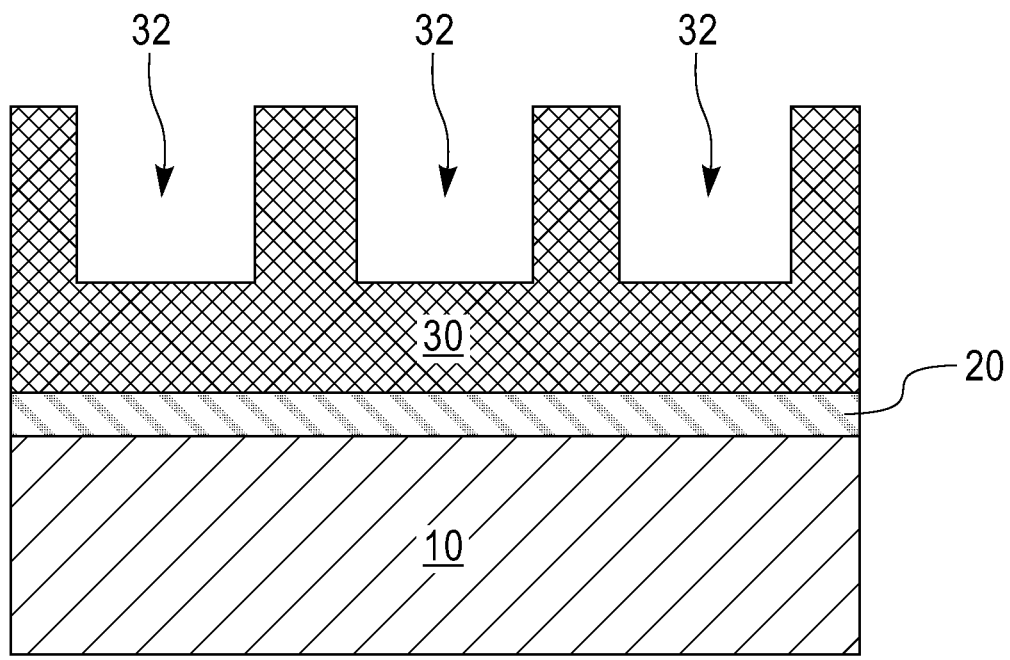
FIG. 1 is a cross-sectional view of a first exemplary semiconductor structure including contact openings formed within a dielectric material layer of a material stack according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a material stack having contact openings 32 formed therein. The material stack is formed on a substrate 10 and includes, from bottom to top, a dielectric cap layer 20 and a dielectric material layer 30. The contact openings 32 may be via openings, trench openings, or a combination of a trench opening and a via opening.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include an interconnect structure including at least one dielectric material layer and metal lines and/or metal via structures embedded therein. The top surface of the substrate 10 can be planar, or can have a non-planar topography.

The dielectric cap layer 20 can protect underlying substrate 10 from impurities that may diffuse down from upper levels, and can function as a diffusion barrier layer that prevents vertical diffusion of metallic impurities, moisture, or other gaseous impurities. The dielectric cap layer 20 may include, for example, silicon nitride, silicon oxynitride, silicon carbide, nitrogen and hydrogen doped silicon carbide (SiCNH) or a combination thereof. The dielectric cap layer 20 may be formed, for example, by chemical vapor deposition (CVD) or atomic layer deposition (ALD). The thickness of the dielectric cap layer 20 can be from 25 nm to 50 nm, although lesser and greater thicknesses can also be employed. The dielectric cap layer 20 is optional and can be omitted in some embodiments of the present application.

The dielectric material layer 30 typically includes a low-k dielectric material. By "low-k" it is meant a dielectric material having a dielectric constant that is about 4.0 or less. Exemplary low-k dielectric materials include, but are not limited to, silicon dioxide, organosilicates, silsequioxanes, undoped silicate glass (USG), fluorosilicate glass (FSG), SiCOH and borophosphosilicate glass (BPSG). The dielectric material layer 30 may be formed by CVD, plasma enhanced chemical vapor deposition (PECVD) or spin coating. The thickness of the dielectric material layer 30 may be from 100 nm to 1,000 nm, although lesser and greater thicknesses can also be employed.

The contact openings 32 can be formed by any suitable lithography and etching processes known in the art. First, a mask layer (not shown) is applied over the dielectric material layer 30 and lithographically patterned to form a patterned of openings therein. The openings overlie areas in which formation of the contact openings 32 are desired. The mask layer can be a photoresist layer or a photoresist layer in conjunction with hardmask layer(s). The pattern in the mask layer is transferred into the dielectric material layer 30 by an anisotropic etch to form the contact openings 32. The anisotropic etch can be a dry etch such as an reactive ion etch (RIE), or by a wet chemical etch employing a dilute hydrofluoric acid solution. After forming the contact openings 32, the remaining portions of the mask layer can be removed by oxygen-based plasma etching.

Figure 2:
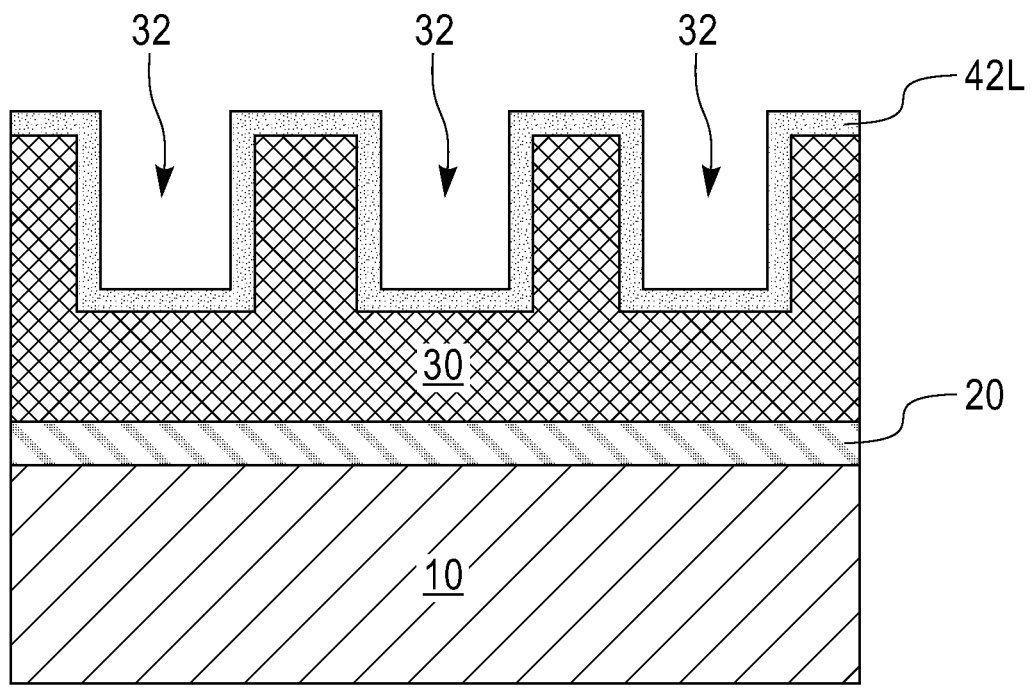
FIG. 2 is a cross-sectional view of the first exemplary semiconductor structure of FIG. 1 after forming a metal liner layer along sidewalls and bottom surfaces of the contact openings and over the top surface of the dielectric material layer.

Referring to FIG. 2, a metal liner layer 42L is conformally deposited along sidewalls and bottom surfaces of the contact openings 32 and over the top surface of the dielectric material layer 30. The metal liner layer 42L may include a nitride of an alloy having a low electrical resistivity. The resistivity of these low resistivity alloys is typically less than 100 μΩ-cm. Exemplary low electrical resistivity alloys that can be employed in the present application include, but are not limited to, titanium aluminum (TiAl), magnesium aluminum (MgAl), magnesium titanium (MgTi), magnesium vanadium (MgV) and aluminum vanadium (AlV). Thus, the metal liner layer 42L can include a metal nitride such as titanium aluminum nitride (TiAlN), magnesium aluminum nitride (MgAlN), magnesium titanium nitride (MgTiN), magnesium vanadium nitride (MgVN) and aluminum vanadium nitride (AlVN). In one embodiment, the metal liner layer 42L includes TiAlN.

The metal liner layer 42L may be deposited using physical vapor deposition (PVD), such as reactive sputtering. As used herein, "sputtering" means a method of depositing a metal film, in which a target of the desired material, i.e., source, is bombarded with particles, e.g., ions, which knock atoms from the target, and the dislodged target material deposits on the deposition surface. As used herein, "reactive sputtering" means using a glow discharge gas or gases that can react with the dislodged target material under sputtering conditions, thereby to deposit a composition thereof on the deposition surface. Examples of sputtering apparatus that may be suitable for depositing the metal liner layer 42L include DC diode type systems, radio frequency (RF) sputtering, magnetron sputtering, and ionized metal plasma (IMP) sputtering.

In one embodiment of the present application, the meal liner layer 42L can be formed by sputtering a single target that contains an alloy of all the required elements in a gas mixture of argon (Ar) and nitrogen ($N_2$). For example, the single target can include an alloy selected from TiAl, MgAl, MgTi, MgV and AlV. In another one embodiment, the metal liner layer 42L can be formed by co-sputtering various elemental metal targets in the gas mixture of Ar and $N_2$. The elemental metal target can include, for example, Ti, Al, Mg or V. The nitrogen in the gas mixture reacts with the sputtered material(s) from the target(s); thereby forming the metal nitride that provides the metal liner layer 42L on the exposed surfaces of the contact openings 32 and the dielectric material layer 30. The sputtering process is typically performed at a temperature (wafer temperature) greater than 300° C. The metal liner layer 42L that is formed can have a thickness less than 2 nm.

Figure 3:
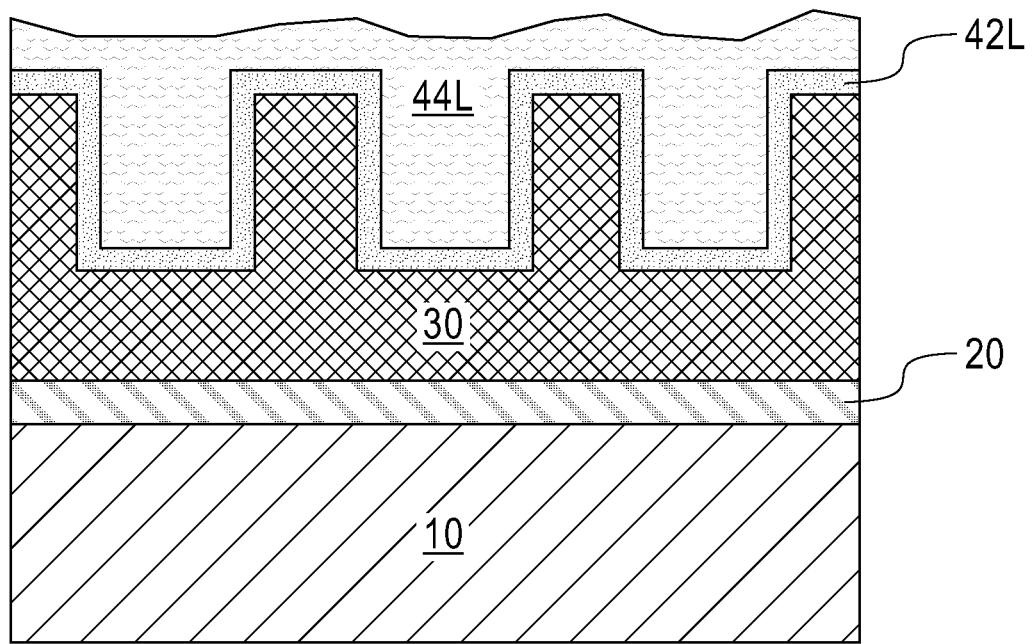
FIG. 3 is a cross-sectional view of the first exemplary semiconductor structure of FIG. 2 after forming a metal contact layer on the metal liner layer to completely fill the contact openings.

Referring to FIG. 3, a metal contact layer 44L is formed in-situ and without air break, on the metal liner layer 42L by sputter deposition to completely fill the contact openings 32. Following the deposition of the metal liner layer 42L, the $N_2$ gas source is switch off while the Ar gas is allowed to continue flow through the sputtering apparatus. The sputtering of the target(s) thus continues, but in the absence of $N_2$, thereby forming the metal contact layer 44L. In some embodiments of the present application, after formation of the metal liner layer 42L, the system can be purged by Ar for a period of time to ensure that all the nitrogen is removed from the sputtering apparatus. The sputtering temperature is maintained to be greater than 300° C. The metal contact layer 44L thus formed includes an alloy selected from TiAl, MgAl, MgTi, MgV and AlV. In one embodiment and when the meal nitride liner layer 42L is composed of TiAlN, the metal contact layer 44L can include TiAl.

In the present application, since the metal contact layer 44L is sputtering deposited on the metal liner layer 42L at a relatively high temperature (>300° C.), the high temperature increases the surface migration of atoms in the alloy that provides the metal contact layer 44L. The alloy can easily fill the contact openings 32. The metal contact layer 44L thus formed is substantially void-free.

In the present application, the metal liner layer 42L and the metal contact layer 44L are deposited in-situ by sputter deposition in a single process by varying the gas compositions (e.g., Ar+$N_2$ for metal nitride that provides the metal liner layer 42 and Ar for metal that provides the metal contact layer 44L) and without air breaks and tool changes. Since there is no air break between the steps of depositing the metal liner layer 42L and depositing the metal contact layer 44L, the metal contact layer 44L is deposited on the metal liner layer 42L without allowing the metal liner layer 42L to be exposed to the oxygen-containing ambient. This prevents the formation of a native oxide between the metal liner layer 42L and the metal contact layer 44L. As a result, the contact resistance between the metal liner layer 42L and the metal contact layer 44L can be reduced.

In addition, in the present application, since no fluorine-based precursor is involved in the present application in formation of the metal contact layer 44L, a thick metal liner layer 42L is no longer needed to prevent the fluorine diffusion. The thickness reduction can lead to a further reduction in the contact resistance between the metal liner layer 42L and the metal contact layer 44L.

Figure 4:
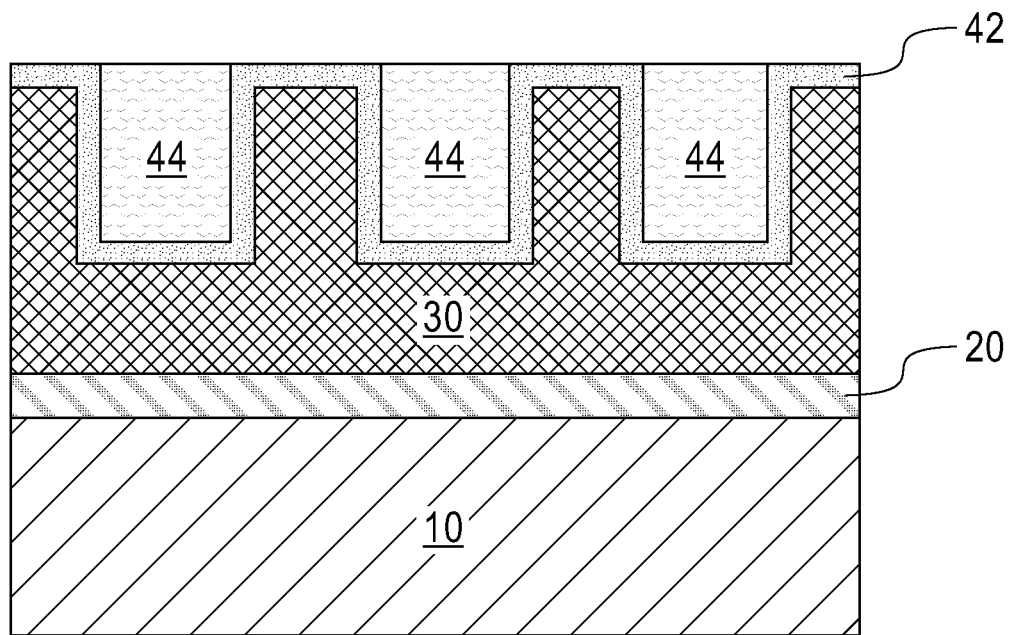
FIG. 4 is a cross-sectional view of the first exemplary semiconductor structure of FIG. 3 after forming a metal liner and a metal contact within each of the contact openings.

Referring to FIG. 4, portions of the metal contact layer 42L and the metal liner layer 44L that are located above the top surface of the dielectric material layer 30 are removed by employing a planarization process, such as, for example, chemical mechanical planarization (CMP). Each remaining portion of the metal liner layer 42L located along sidewalls and the bottom surface of one of the contact openings 32 constitutes a metal liner 42, while each remaining portion of the metal contact layer 44L located within one of the contact openings 32 constitutes a metal contact 44. The top surfaces of the metal liners 42 and the metal contacts 44 are coplanar with the top surface of the dielectric material layer 30. A metal liner 42 and an overlying metal contact 44 within each contact opening 32 together define a contact structure.

The single process described above for in-situ formation of a metal liner layer and a metal contact layer can also be employed to form gate structures for field effect transistor (FETs) in a gate last scheme.

Figure 5:
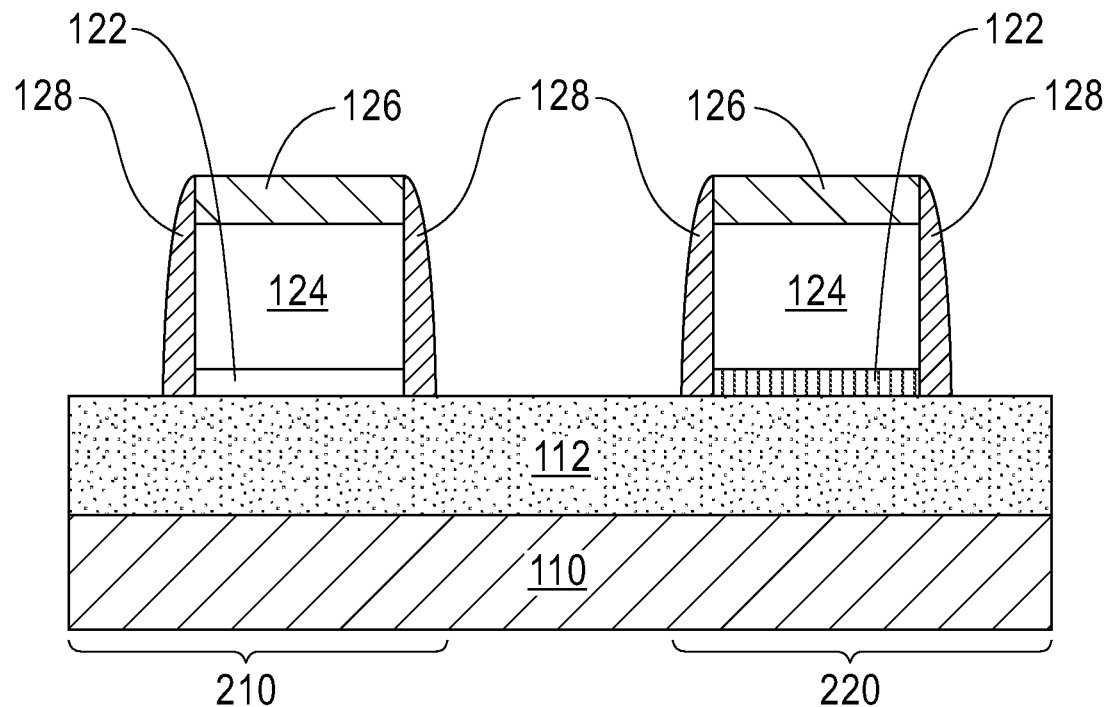
FIG. 5 is a cross-sectional view of a second exemplary semiconductor structure including a first sacrificial gate structure formed over a first portion of a semiconductor fin locate over a substrate and a second sacrificial gate structure formed over a second portion of the semiconductor fin according to a second embodiment of the present application.

Referring to FIG. 5, a second exemplary semiconductor structure according to a second embodiment of the present application includes a first sacrificial gate structure formed over a first portion of a semiconductor fin 112 locate over a substrate 110 and a second sacrificial gate structure formed over a second portion of the semiconductor fin 112. The first sacrificial gate structure is located in a first region 210 of the substrate 110 and the second sacrificial gate structure is located in a second region 220 of the substrate 110. In one embodiment, the first region 210 can be an n-type FinFET region and the second region 220 can be a p-type FinFET region.

In one embodiment, the semiconductor fin 112 can be formed from a bulk substrate including a bulk semiconductor material throughout (not shown). In another embodiment and as shown in FIG. 5, the semiconductor fin 112 and the substrate 110 may be provided from a SOI substrate. The SOI substrate typically includes, from bottom to top, a handle substrate (not shown), a buried insulator layer (i.e. substrate 110) and a top semiconductor layer (not shown) from which the semiconductor fin 16 is formed.

The handle substrate may include a semiconductor material such as, for example, Si, Ge, SiGe, SiC, SiGeC, a III-V compound semiconductor, a II-VI compound semiconductor or any combinations thereof. The handle substrate provides mechanical support to the buried insulator layer and the top semiconductor layer. The thickness of the handle substrate can be from 30 µm to about 2 mm, although less and greater thicknesses can also be employed.

The buried insulator layer may include a dielectric material such as silicon dioxide, silicon nitride, silicon oxynitride, boron nitride or a combination thereof. In one embodiment, the buried insulator layer may be formed by a deposition process, such as CVD, PECVD or PVD. In another embodiment, the buried insulator layer may be formed using a thermal growth process, such as thermal oxidation, to convert a surface portion of the handle substrate. In yet another embodiment, the buried insulator layer can also be formed by implanting oxygen atoms into the handle substrate and thereafter annealing the structure. The thickness of the buried insulator layer can be from 50 nm to 200 nm, although lesser or greater thicknesses can also be employed.

The top semiconductor layer (which is processed into the semiconductor fin 112) may include any semiconductor material as mentioned above for the handle substrate. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate may be the same or different. Typically, each of the handle substrate and the top semiconductor layer comprises a single crystalline semiconductor material, such as, for example, single crystalline silicon. The top semiconductor layer can be formed by a deposition process, such as CVD or PECVD. The top semiconductor layer that is formed may have a thickness from 10 nm to 200 nm, although lesser or greater thicknesses can also be employed. Alternatively, the top semiconductor layer may be formed using a smart cut process where two semiconductor wafers are bonded together with an insulator in between.

In some embodiments of the present application, a hard mask layer (not shown) can be formed on the top semiconductor layer prior to forming the semiconductor fin 112. When employed, the hard mask layer may comprise an oxide, nitride, oxynitride or any combination thereof including multilayers. In one embodiment, the hard mask layer includes silicon dioxide or silicon nitride. The hard mask layer can be formed utilizing a conventional deposition process such as, for example, CVD or PECVD. Alternatively, the hard mask layer can be formed by a thermal process such as, for example, oxidation or nitridation of the top semiconductor layer. Any combination of the above mentioned processes can also be used in forming the hard mask layer. The hard mask layer that is formed can have a thickness from 20 nm to 80 nm, although lesser or greater thicknesses can also be employed.

In one embodiment, the semiconductor fin 112 can be formed by lithography and etching. The lithographic step includes applying a photoresist layer (not shown) atop the top semiconductor layer (or the hard mask, if present), exposing the photoresist layer to a desired pattern of radiation, and developing the exposed photoresist layer utilizing a conventional resist developer. The etching process comprises dry etching such as, for example, RIE and/or wet etching. The etching process transfers the pattern from the patterned photoresist layer to the top semiconductor layer or first to the hard mask layer, if present, and thereafter to the underlying top semiconductor layer utilizing the buried insulator layer as an etch stop. After transferring the pattern into the top semiconductor layer, the patterned photoresist layer can be removed utilizing a conventional resist stripping process such as, for example, ashing. Alternatively, the semiconductor fin 112 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins have been formed. The semiconductor fin 112 can also be formed utilizing a direct self-assembly patterning process.

The semiconductor fin 112 can have a rectangular horizontal cross-sectional area. The width of the semiconductor fin 112 can be from 5 nm to 100 nm, although lesser and greater widths can also be employed. The height of the semiconductor fin 112 can be from 10 nm to 200 nm, although lesser and greater heights can also be employed.

In some embodiments of the present application and when the hard mask layer is present, the hard mask layer that remains atop the semiconductor fin 112 can be removed at this stage. The removal of the remaining non-etched portion of hard mask layer can be achieved by performing a selective etching process or by utilizing a planarization process such as CMP.

Each of the first and second sacrificial gate structure includes a sacrificial gate stack and a gate spacer 28 formed on sidewalls of the sacrificial gate stack. The sacrificial gate stack may include, from bottom to top, a sacrificial gate dielectric 122, a sacrificial gate conductor 124 and a sacrificial gate cap 126. The sacrificial gate stacks (122, 124, 126) can be formed by first providing a material stack (not shown) that includes, from bottom to top, a sacrificial gate dielectric layer, a sacrificial gate conductor layer and a sacrificial gate cap layer over the semiconductor fin 112 and the substrate 110. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer may include silicon oxide, silicon nitride, or silicon oxynitride. The sacrificial gate dielectric layer can be formed, for example, by CVD or PVD. The sacrificial gate dielectric layer can also be formed by conversion of a surface portion of the semiconductor fin 112 by thermal oxidation or nitridation. The sacrificial gate dielectric layer that is formed may have a thickness from 1 nm to 10 nm, although lesser and greater thicknesses can also be employed.

The sacrificial gate conductor layer may include a semiconductor material such as polysilicon or a silicon-containing semiconductor alloy such as a silicon-germanium alloy. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stacks (122, 124, 126). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portions of the material stack after the pattern transfer constitute the sacrificial gate stacks (122, 124, 126). The patterned photoresist layer may be subsequently removed by, for example, ashing.

Each gate spacer 128 may include a dielectric material such as, for example, an oxide, a nitride, an oxynitride, or any combination thereof. In one embodiment, each gate spacer 128 is composed of silicon nitride. The gate spacers 128 can be formed by first providing a conformal gate spacer material layer (not shown) on exposed surfaces of the sacrificial gate stacks (122, 124, 126), the semiconductor fin 112 and the substrate 110 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portions of the gate spacer material layer constitute the gate spacer(s) 28. The width of each gate spacer 28, as measured at the base of the gate spacer 28 can be from 5 nm to 100 nm, although lesser and greater widths can also be employed.

Figure 6:
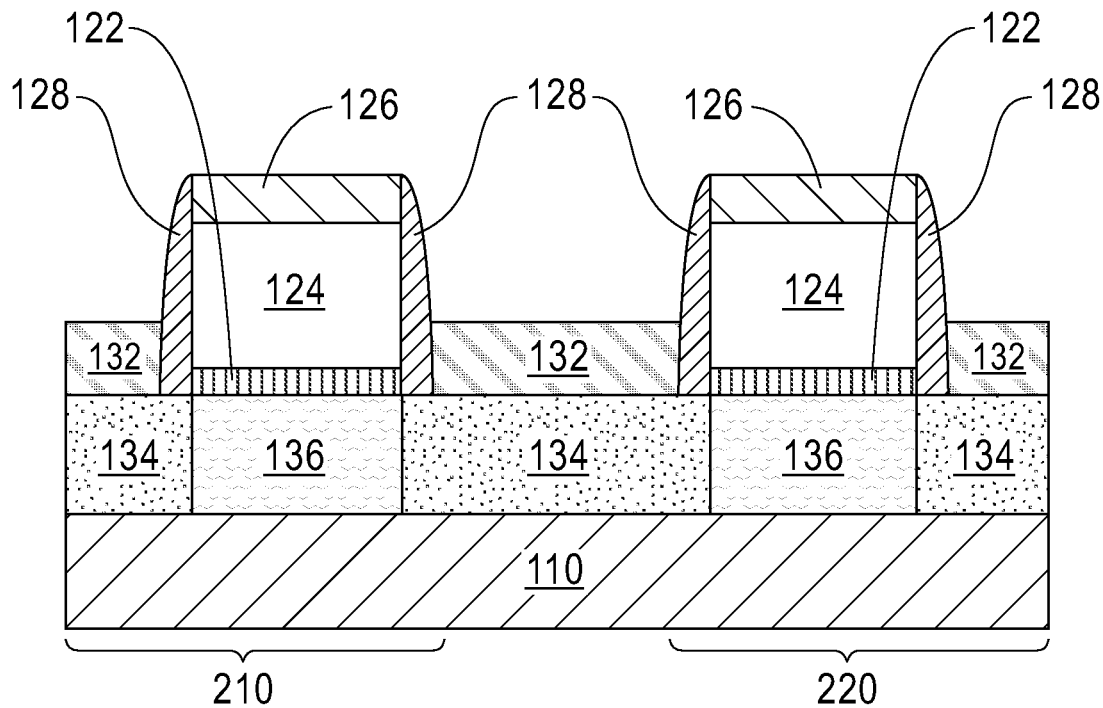
FIG. 6 is a cross-sectional view of the second exemplary semiconductor structure of FIG. 5 after forming source/drain regions on opposition sides of each of the first and second sacrificial gate structures.

Referring to FIG. 6, an epitaxial source region and an epitaxial drain region (collectively referred to as epitaxial source/drain regions 132) are formed over portions of the semiconductor fin 112 located on opposite sides of each of the first and second sacrificial gate structures (122, 124, 126, 128). As used herein, a "source/drain" region can be a source region or a drain region depending on subsequent wiring and application of voltages during operation of a FinFET. The epitaxial source/drain regions 132 can be formed by epitaxially depositing a semiconductor material over exposed semiconductor surfaces, i.e., top and sidewall surfaces of the semiconductor fin 112, but not on dielectric surfaces such as the surfaces of the sacrificial gate caps 126, the gate spacers 128 and the substrate 110. In one embodiment, the selective epitaxy growth process can proceed until the epitaxial source/drain regions 132 merge neighboring semiconductor fins (not shown).

The semiconductor material that provides the epitaxial source/drain regions 132 can include Si, Ge, SiGe or SiC. In one embodiment, the epitaxial source/drain regions 132 are composed of SiGe for formation of p-type FinFETs. In another embodiment, the epitaxial source/drain regions 132 are composed of Si for formation of n-type FinFETs.

In one embodiment, the epitaxial source/drain regions 132 can be formed with in-situ doping during the selective epitaxy process. Thus, the epitaxial source/drain regions 132 can be formed as doped semiconductor material portions. Alternatively, the epitaxial source/drain regions 132 can be formed by ex-situ doping. In this case, the epitaxial source/drain regions 132 can be formed as intrinsic semiconductor portions and n-type or p-type dopants can be subsequently introduced into the epitaxial source/drain regions 132 to convert the intrinsic semiconductor material portions into doped semiconductor material portions. Exemplary n-type dopants include, but are not limited to, P, As and Sb. Exemplary p-type dopants include, but are not limited to, Al, B, Ga and In.

If ex-situ doping is employed, ion implantation or gas phase doping can also introduce dopants into portions of the semiconductor fin 112 that do not underlie the sacrificial gate stacks (122, 124, 126). The resulting doped portions within the semiconductor fin 112 are herein referred to fin source/drain regions 134. If in-situ doping is employed, an anneal process can be performed to outdiffuse dopants from the epitaxial source/drain regions 132 into underlying portions of the semiconductor fin 112 to form the fin source/drain regions 134. The epitaxial source/drain regions 132 and the fin source/drain regions 134 together constitute source/drain regions for FinFETs. A remaining portion of the semiconductor fin 112 that is located beneath a corresponding sacrificial gate stack (122, 124, 126) constitutes a channel region 136 of a FinFET.

Figure 7:
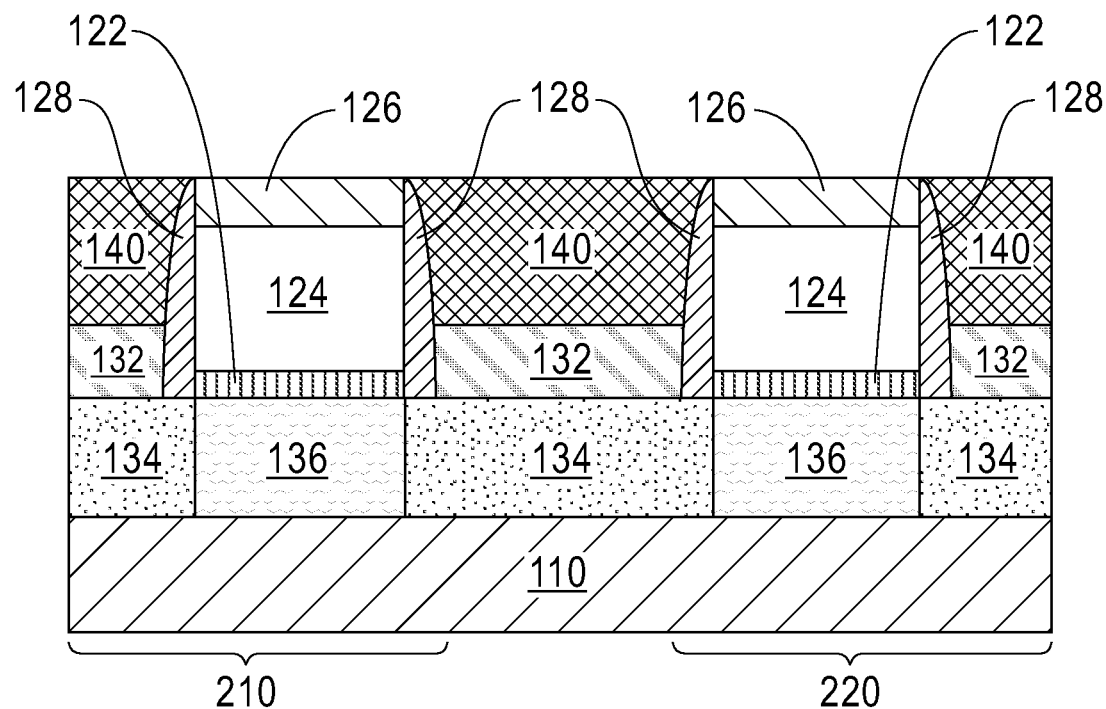
FIG. 7 is a cross-sectional view of the second exemplary semiconductor structure of FIG. 6 after forming an interlevel dielectric (ILD) layer over the source/drain regions and the substrate and laterally surrounds the first and second sacrificial gate structures.

Referring to FIG. 7, an interlevel dielectric (ILD) layer 140 is formed over the epitaxial source/drain regions 132 and the substrate 110 and laterally surrounds the first and second sacrificial gate structures (122, 124, 126, 128). In some embodiments of the present application, the ILD layer 140 is composed of a dielectric material that may be easily planarized. For example, the ILD layer 140 can include a doped silicate glass, an undoped silicate glass (silicon oxide), an organosilicate glass (OSG), a porous dielectric material, or amorphous carbon. The ILD layer 140 can be deposited using a conventional deposition process such as, for example, CVD, PECVD or spin coating. If the ILD layer 140 is not self-planarizing, following the deposition of the ILD layer 140, the ILD layer 140 can be subsequently planarized, for example, by CMP using the topmost surfaces of the first and second sacrificial gate stacks (122, 124, 126) (i.e., the top surfaces of the sacrificial gate caps 126) as an etch stop so that a top surface of the ILD layer 40 is coplanar with the top surfaces of the sacrificial gate caps 126.

Figure 8:
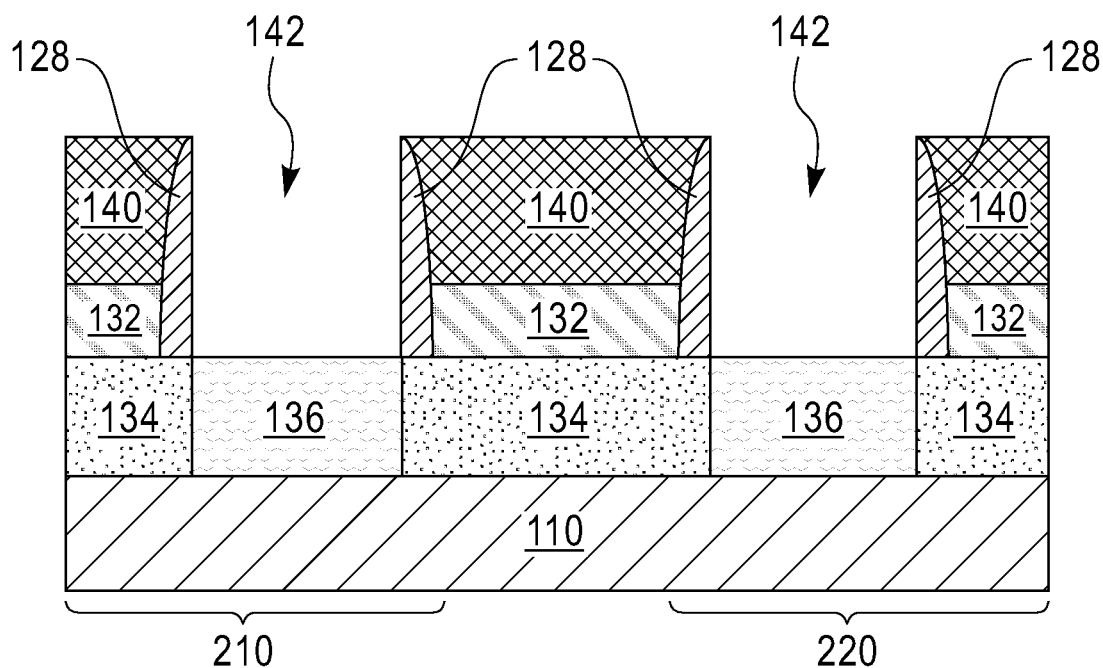
FIG. 8 is a cross-sectional view of the second exemplary semiconductor structure of FIG. 7 after removing sacrificial gate stacks in the first and second sacrificial gate structures to provide gate cavities

Referring to FIG. 8, the sacrificial gate stacks (122, 124, 126) are removed from the sacrificial gate structures (122, 124, 126, 128) to provide gate cavities 142. The sacrificial gate stacks (122, 124, 126) can be removed selectively to the substrate 110, the semiconductor fin 112, the gate spacers 28 and the ILD layer 140 by at least one etch, which can be a dry etch and/or a wet etch. Each of the gate cavities 142 occupies a volume from which a corresponding sacrificial gate stack (122, 124, 126) is removed and is laterally confined by inner sidewalls of the gate spacer 128.

Figure 9:
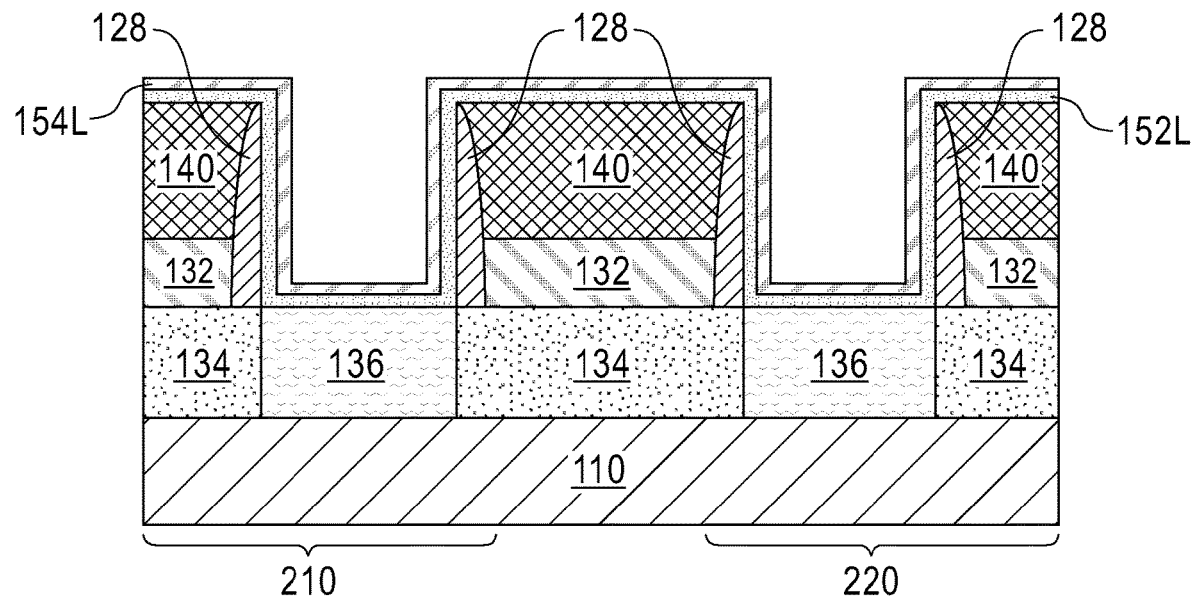
FIG. 9 is a cross-sectional view of the second exemplary semiconductor structure of FIG. 8 after forming a gate dielectric layer along sidewalls and bottom surfaces of the gate cavities and over the top surface of the ILD layer and forming a work function metal layer over the gate dielectric layer.

Referring to FIG. 9, a gate dielectric layer 152L is formed along sidewalls and bottom surfaces of the gate cavities 142 and over the top surface of the ILD layer 140. The gate dielectric layer 152L may include a high dielectric constant (high-k) material having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer 152L can be formed by a conventional deposition process, such as, for example, CVD, PVD, or ALD. The gate dielectric layer 152L that is formed may have a thickness ranging from 0.9 nm to 6 nm, with a thickness ranging from 1.0 nm to 3 nm being more typical. The gate dielectric layer 152L may have an effective oxide thickness on the order of or less than 1 nm.

A work function metal layer 154L is subsequently deposited on the gate dielectric layer 152L. The work function metal layer 154L may include TiN, TaN, WN, TiC, TaC or WC. In one embodiment, the work function metal layer 154L is composed of TiN, a nitride commonly used as a p-type work functional metal in a p-type metal gate structure. The work function metal layer 154 may be formed by CVD, PVD or ALD. The work function metal layer 154L that is formed may have a thickness ranging from 1 nm to 10 nm, although lesser and grater thicknesses can also be employed.

Figure 10:
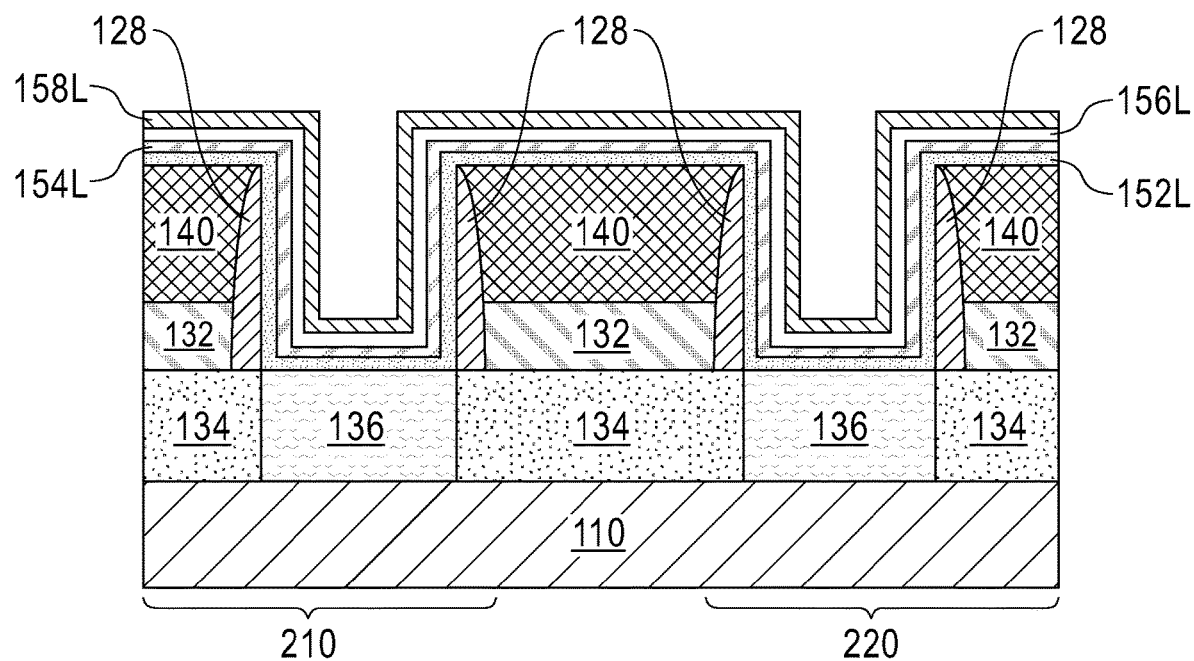
FIG. 10 is a cross-sectional view of the second exemplary semiconductor structure of FIG. 9 after forming a first metal liner layer over the work function metal layer and forming a second metal liner layer over the first metal liner layer.

Referring to FIG. 10, a first metal liner layer 156L is formed on the work functional metal layer 154L. The first metal liner layer 156L may include a metal carbide such as, for example, titanium aluminum carbide (TiAlC), magnesium aluminum carbide (MgAlC), magnesium titanium carbide (MgTiC), magnesium vanadium carbide (MgVC) or aluminum vanadium carbide (AlVC). In one embodiment, the first metal liner layer 156L includes TiAlC.

The first metal liner layer 156L can be deposited using reactive sputter deposition. In one embodiment, the first metal liner layer 156L can be formed by sputtering a single target that contains an alloy of all the required elements in a first gas mixture containing hydrocarbon such as methane, ethane or ethylene and Ar. The single target can include an alloy selected from the group consisting of TiAl, MgAl, MgTi, MgV and AlV. In another one embodiment, the first metal liner layer 156L can be formed by co-sputtering various elemental metal targets in the first gas mixture containing hydrocarbon and Ar. The elemental metal target can include Ti, Al, Mg or V. The carbon in the hydrocarbon of the first gas mixture reacts with the sputtered material(s) from the target(s); thereby forming the metal carbide that provides the first metal liner layer 156L. The first metal liner layer 156L that is formed may have a thickness ranging from 1 nm to 5 nm, although lesser and greater thicknesses can also be employed.

A second metal liner layer 158L is subsequently formed in-situ, without an air break, on the first metal liner layer 156L by reactive sputter deposition. The second metal liner layer 158L may include a metal nitride such as, for example, TiAlN, MgAlN, MgTiN, MgVN or AlVN. In one embodiment, the second metal liner layer 158L includes TiAlN. Following the deposition of the first metal liner layer 156L, the hydrocarbon gas source is switched off and a second gas mixture containing Ar and $N_2$ is flowed through the sputtering apparatus. The nitrogen in the second gas mixture reacts with the sputtered material(s) from the target(s); thereby forming the metal nitride that provides the second metal liner layer 158L. In some embodiments of the present application, after formation of the first metal liner layer 156L, the system may be purged by Ar for a period of time to ensure that all the hydrocarbon is removed from the sputtering apparatus.

Figure 11:
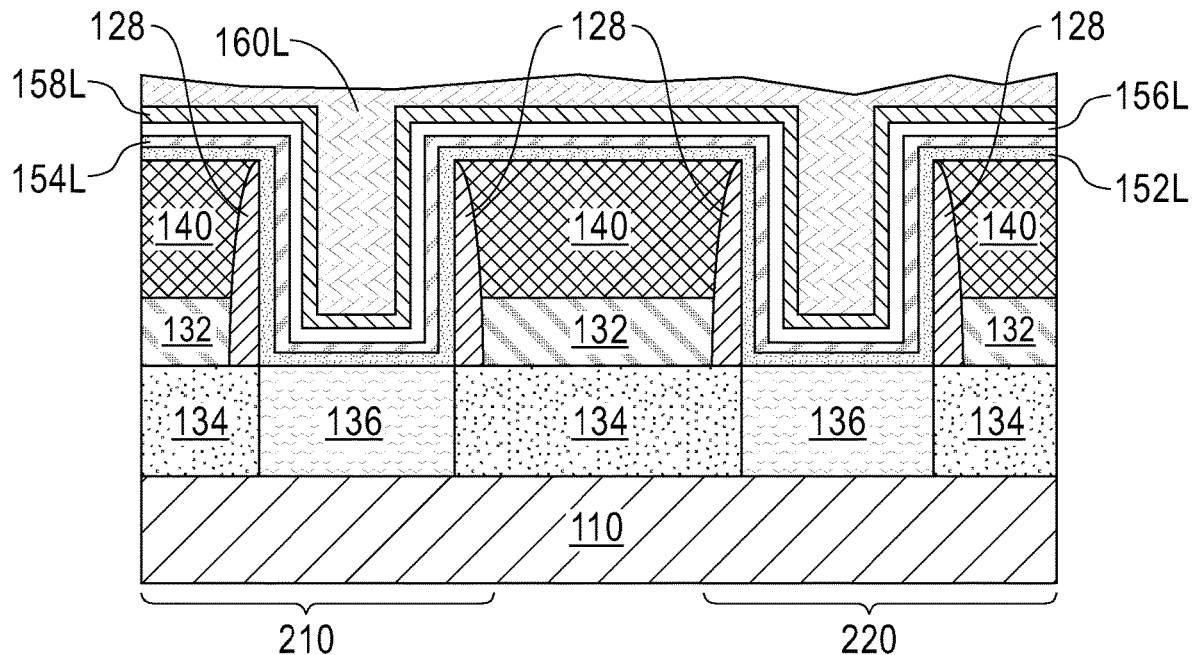
FIG. 11 is a cross-sectional view of the second exemplary semiconductor structure of FIG. 10 after forming a metal gate layer over the second metal liner layer to completely fill the gate cavities.

Referring to FIG. 11, a metal gate layer 160L is formed on the second metal liner layer 158L and within a remaining volume of each of the gate cavities 142 to completely fill the gate cavities 142. The metal gate layer 160L can be formed by sputter deposition. Following the formation of the second metal liner layer 158L, without an air break, the nitrogen gas source is switched off, while the Ar gas is allowed to continue flow through the sputtering apparatus. The sputtering of the target(s) thus continues, but in the absence of nitrogen, thereby forming the metal gate layer 160L solely composed of metals from the target(s). In some embodiments of the present application, after formation of the second metal liner layer 158L, the system may be purged by Ar for a period of time to ensure that all the nitrogen is removed from the sputtering apparatus. The metal gate layer 160L thus formed includes an alloy selected from TiAl, MgAl, MgTi, MgV and AlV. In one embodiment and when the first metal liner layer 156L is composed of TiAlC and the second metal liner layer 158L is composed of TiAlN, the metal gate layer 160L can include TiAl.

The sputter deposition of each of the first metal liner layer 156L, the second metal liner layer 158L and the metal gate layer 160L is typically conducted at a temperature greater than 300° C. Since the metal gate layer 160L is sputtering deposited on the second metal liner layer 158L at a relatively high temperature (>300° C.), the high temperature increases the surface migration of atoms in the alloy that provides the metal gate layer 160L. The alloy can easily fill the gate cavities 142. The metal gate layer 160L thus formed is substantially void-free.

In the present application, the first metal liner layer 156L, the second metal liner layer 158L and the metal gate layer 160L are deposited in-situ by sputter deposition in a single process without air breaks and tool changes. Since there are no air breaks between the steps of depositing the first metal liner layer 156L, the second metal liner layer 158L and the metal gate layer 160L, during the deposition, no exposure of the first and second metal liner layer to the oxygen occurs. This prevents formation of an native oxide between each of the first and second metal liner layer 156L, 158L and the second metal liner layer 158L and the metal gate layer 160. As a result, the contact resistance between each of the first and second metal liner layer 156L, 158L and the second metal liner layer 158L and the metal gate layer 160 can be reduced.

In addition, in the present application the film compositions can be changed simply by varying the gas compositions (e.g., Ar+hydrocarbon for metal carbide that provides the first metal liner layer 156L, Ar+$N_2$ for metal nitride that provides the second metal liner layer 158L and Ar for metal that provides the metal gate layer 160). The contact resistance of the metal liner layers 156L, 158L can be easily tuned.

Figure 12:
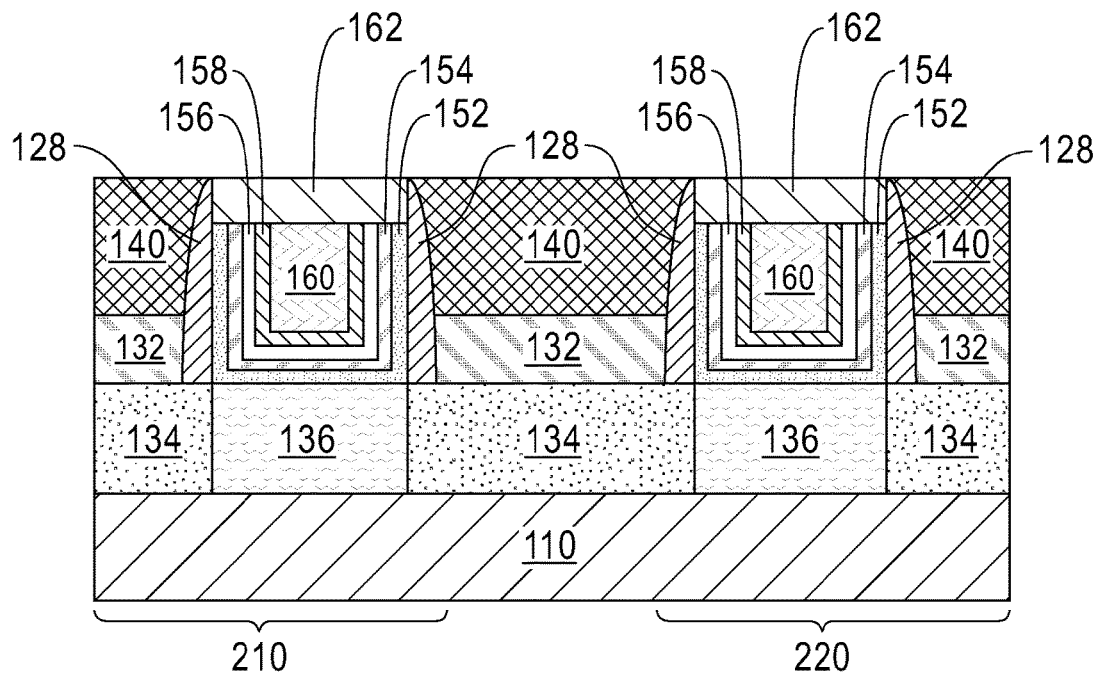
FIG. 12 is a cross-sectional view of the second exemplary semiconductor structure of FIG. 11 after forming a functional gate structure within each of the gate cavities.

Referring to FIG. 12, portions of the metal gate layer 160L, the second metal liner layer 158L, the first metal liner layer 156L, the work function metal 154L and the gate dielectric layer 152L that are formed above the top surface of the ILD layer 140L are removed, for example, by CMP. In some embodiments and as illustrated, the remaining portions of the metal gate layer 160L, the second metal liner layer 158L, the first metal liner layer 156L, the work function metal 154L and the gate dielectric layer 152L may be recessed utilizing a dry etch or a wet etch to provide a void (not shown) in each of the gate cavities 142. Each remaining portion of the metal gate layer 160L constitutes a metal gate electrode 160. Each remaining portion of the second metal liner layer 158L constitutes a second metal liner 158. Each remaining portion of the first metal liner layer 156L constitutes a first metal liner 156. Each remaining portion of the work function metal layer 154L constitutes a work function metal 154. Each remaining portion of the gate dielectric layer 152L constitutes a gate dielectric 152.

A dielectric material is then deposited over the gate dielectric 152, the work function metal 154, the first metal liner 156, the second metal liner 158 and the metal gate electrode 160 in each of the gate cavities 142 to completely fill the void. The deposited dielectric material is then planarized, for example, by CMP using the top surface of the ILD layer 140 as an etch stop to form a gate cap 162 within each of the gate cavities 142. The top surface of the gate cap 162 thus is coplanar with the top surface of the ILD layer 140. Exemplary dielectric materials that can be employed in the gate cap 162 include, but are not limited to, silicon nitride, silicon carbide nitride or silicon boron carbonitride.

A functional gate stack is thus formed within each of the gate cavities 142 and is laterally surrounded by the gate spacer 128. Each functional gate stack includes a U-shaped gate dielectric 152 located on sidewalls and a bottom surface of one of the gate cavities 142, a U-shaped work function metal 154 located over the gate dielectric 152, a U-shaped first metal liner 156 located over the work function metal 154, a U-shaped second metal liner 158 located over the first metal liner 156, a meal gate electrode 160 located over the second metal liner 158 and a gate cap 162 located over top surfaces of the gate dielectric 152, the work function metal 154, the first metal liner 156, the second metal liner 158 and the meal gate electrode 160.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A metallization structure comprising;
   a contact opening laterally surrounded by a dielectric material layer located over a substrate;
   a metal liner located along sidewalls and a bottom surface of the contact opening; and
   a metal contact located on the metal liner to fill a remaining volume of the contact opening,
   wherein the metal contact comprises an alloy selected from the group consisting of MgAl, MgTi, MgV and AlV, and the metal liner comprises a nitride of the alloy.

2. The metallization structure of claim 1, further comprising a dielectric cap layer located between the dielectric material layer and the substrate.

3. The metallization structure of claim 1, wherein the contact opening only extends through a portion of the dielectric material layer.

4. The metallization structure of claim 1, wherein the metal liner has a resistivity of less than 100 µohms-cm.

5. The metallization structure of claim 1, wherein the metal liner is located on a sidewall and a bottom wall of the metal contact that is located in the contact opening.

6. The metallization structure of claim 1, wherein the metal liner has a thickness of less than 2 nm.

7. The metallization structure of claim 1, wherein the metal contact is void-free.

8. The metallization structure of claim 1, wherein the alloy that provides the metal contact is selected from the group consisting of MgTi, MgV and AlV.

9. The metallization structure of claim 1, wherein the alloy that provides the metal contact is selected from the group consisting of MgV and AV.

10. The metallization structure of claim 1, wherein the metal contact structure has a topmost surface that is coplanar with a topmost surface of both the metal liner and the dielectric material layer.

11. The metallization structure of claim 1, wherein the metal liner is U-shaped.

12. The metallization structure of claim 1, wherein the metal contact structure directly contacts the metal liner.

13. The metallization structure of claim 1, wherein no native oxide is positioned between the metal contact structure and the metal liner.

* * * * *